United States Patent
Chen et al.

(10) Patent No.: US 7,682,908 B2
(45) Date of Patent: Mar. 23, 2010

(54) NON-VOLATILE MEMORY AND OPERATING METHOD THEREOF

(75) Inventors: Hsin-Ming Chen, Tainan County (TW); Hai-Ming Lee, Taipei (TW); Shih-Jye Shen, Hsinchu (TW); Ching-Hsiang Hsu, Hsinchu (TW)

(73) Assignee: eMemory Technology Inc., Hsin-Chu (TW)

( * ) Notice: Subject to any disclaimer, the term of this patent is extended or adjusted under 35 U.S.C. 154(b) by 785 days.

(21) Appl. No.: 11/163,716

(22) Filed: Oct. 28, 2005

(65) Prior Publication Data

US 2007/0045716 A1 Mar. 1, 2007

(51) Int. Cl.
*H01L 21/336* (2006.01)
*H01L 27/088* (2006.01)
*H01L 27/108* (2006.01)

(52) U.S. Cl. .............. 438/266; 257/314; 257/321; 257/E29.307

(58) Field of Classification Search .......... 438/263, 438/257, 266, 275, 276, 279, 309, 313, 315, 438/316, 322, 325, 327, 334–340, 591; 257/321, 257/300, 314, E27.104, E27.103, E21.209, 257/E21.662, E21.663, E21.665, E21.679, 257/E21.422, E29.307

See application file for complete search history.

(56) References Cited

U.S. PATENT DOCUMENTS

| | | | | |
|---|---|---|---|---|
| 4,686,558 | A | * | 8/1987 | Adam ................. 257/321 |
| 5,198,380 | A | * | 3/1993 | Harari ................ 438/257 |
| 5,712,180 | A | * | 1/1998 | Guterman et al. ...... 438/263 |
| 6,794,711 | B2 | * | 9/2004 | Kang et al. .......... 257/315 |
| 6,833,582 | B2 | | 12/2004 | Mine et al. .......... 257/326 |
| 2007/0040211 | A1 | * | 2/2007 | Ku et al. ............ 257/324 |

* cited by examiner

*Primary Examiner*—Leonardo Andújar
*Assistant Examiner*—Monica D Harrison
(74) *Attorney, Agent, or Firm*—Jianq Chyun IP Office

(57) ABSTRACT

A non-volatile memory including a substrate, a first doped region, a second doped region, a third doped region, a first gate structure, and a second gate structure is disclosed. The doped regions are disposed in the substrate and the second doped region is disposed between the first doped region and the third doped region. The first gate structure is disposed on the substrate between the first doped region and the second doped region. The second gate structure is disposed on the substrate between the second doped region and the third doped region, and comprises a tunneling dielectric layer, a charge trapping structure and a gate from the bottom up.

17 Claims, 2 Drawing Sheets

NON-VOLATILE MEMORY AND OPERATING METHOD THEREOF

BACKGROUND OF THE INVENTION

1. Field of the Invention

The present invention relates to a memory and an operating method thereof, and more particularly, to a non-volatile memory and a method for operating the same.

2. Description of the Related Art

The non-volatile memory, with such advantage as multiple data reading, writing, and erasing operations, and the data storage protection even when power is off, has become a widely used memory component in the personal computer and the electronic device.

Referring to FIG. 1, a schematic diagram of a non-volatile memory disclosed in U.S. Pat. No. 6,833,528 by Toshiyuki et al is shown. The non-volatile memory comprises two metal-oxide semiconductor (MOS) transistors, and each transistor comprises a p-well 101, an n-doped region (drain) 107A, and an n-doped region (source) 107B that are all formed on a silicon substrate. Wherein, one transistor is a select transistor composed of a gate insulating layer 102 and a select gate 103. The other transistor is a memory transistor composed of a bottom oxide layer 104a, a charge trapping layer 104b, a top oxide layer 104c (i.e. oxide-nitride-oxide, ONO), and a memory gate 105. The gates 103 and 105 are insulated by an insulating layer 106. In addition, a part of the select transistor is extended onto the memory transistor.

The non-volatile memory mentioned above has several problems. For example, when the hydrofluoric acid is used as an etching agent when fabricating the non-volatile memory mentioned above, the thickness of the top oxide layer 104c is hard to control. In addition, since the non-volatile memory has a two-layer gate, it is very hard to integrate the non-volatile memory into the general CMOS logic process. Moreover, since its gate has two layers, the manufacturing cost of the entire non-volatile memory is inevitably increased. Furthermore, since a part of the select transistor is extended onto the memory transistor, the alignment between the first gate and the second gate becomes a key success factor. If the alignment error increases, the channel length would further depart from the origin design, and the manufacturing process is more complicated.

SUMMARY OF THE INVENTION

Therefore, it is an object of the present invention to provide a non-volatile memory, which can be easily integrated into the general CMOS logic process, such that the manufacturing process is simplified, so as to improve the competitiveness of the embedded non-volatile memory.

It is another object of the present invention to provide a method for operating the non-volatile memory, in which the channel hot holes are used to induce the hot electron injection, so as to improve the operating efficiency of the memory.

A non-volatile memory at least comprising a substrate, a first doped region, a second doped region, a third doped region, a first gate structure, and a second gate structure is provided by the present invention. Wherein, the first, second, and third doped regions are disposed in the substrate and the second doped region is disposed between the first doped region and the third doped region. The first gate structure is disposed on the substrate between the first doped region and the second doped region. The second gate structure is disposed on the substrate between the second doped region and the third doped region, and comprises a tunneling dielectric layer, a charge trapping structure and a gate from the bottom up.

In the non-volatile memory according to an embodiment of the present invention, the first, second, and third doped regions may be p-doped regions, and the substrate may be an n-substrate.

In the non-volatile memory according to an embodiment of the present invention, a well may be further disposed in the substrate, and the first, second, and third doped regions are disposed in the well, respectively.

In the non-volatile memory according to an embodiment of the present invention, the first, second, and third doped regions may be p-doped regions, the well may be an n-well, and the substrate may be a p-substrate.

In the non-volatile memory according to an embodiment of the present invention, the material of the charge trapping structure may be silicon nitride or silicon oxynitride, that of the tunneling dielectric layer may be silicon oxide, and that of the gate may be doped polysilicon.

In the non-volatile memory according to an embodiment of the present invention, the first gate structure, from the substrate up, may comprise a gate dielectric layer and a select gate. The material of the select gate may be polysilicon, and the material of the gate dielectric layer may be silicon oxide.

In the non-volatile memory according to an embodiment of the present invention, the sidewalls of the first gate structure and the second gate structure further comprise a spacer.

The present invention further provides a method for operating a p-channel non-volatile memory. The p-channel non-volatile memory comprises a select transistor and a memory transistor that are serially connected on the substrate. Wherein, the source of the select transistor is electrically coupled to a source line, and the drain of the select transistor is serially connected to the source of the memory transistor. The memory transistor comprises a tunneling dielectric layer, a charge trapping structure, and a gate from the bottom up. In addition, the drain of the memory transistor is electrically coupled to a bit line. The operating method comprises the following steps.

During the erase operation, a first voltage is applied on the gate of the memory transistor, a second voltage is applied on the drain of the memory transistor, a third voltage is applied on the substrate, and the source of the select transistor is floating or a fourth voltage is applied on the gate of the select transistor to turn off the select transistor. Meanwhile, the electrons stored in the charge trapping structure are pulled out and moved to the gate, and the holes are injected into the charge trapping structure from the gate to erase the memory transistor. Wherein, the first voltage is greater than the second voltage and also the third voltage.

The method for operating the p-channel non-volatile memory according to an embodiment of the present invention further comprises the following steps. During the program operation, a fifth voltage is applied on the gate of the memory transistor, a sixth voltage is applied on the source of the select transistor, a seventh voltage is applied on the drain of the memory transistor, an eighth voltage is applied on the substrate, and a ninth voltage is applied on the gate of the select transistor, such that the memory transistor is programmed by the channel-hot-hole-induced hot-electron-injection effect. Wherein, the ninth voltage turns on the select transistor during the program operation. In addition, the sixth voltage is greater than the seventh voltage, and the eighth voltage is greater than or equal to the fifth voltage.

In the method for operating the p-channel non-volatile memory according to an embodiment of the present invention, the first voltage mentioned above is 12 volts, the second voltage is 0 volt, the third voltage is 0 volt, and the fourth voltage is 0 volt.

In the method for operating the p-channel non-volatile memory according to an embodiment of the present invention, the fifth voltage mentioned above is 4 volts, the sixth voltage is 5 volts, the seventh voltage is 0 volt, the eighth voltage is 5 volts, and the ninth voltage is 0 volt.

In the method for operating the p-channel non-volatile memory according to an embodiment of the present invention, the material of the charge trapping structure may be silicon nitride or silicon oxynitride, and that of the gate may be p-doped polysilicon.

Since a tunneling dielectric layer and a charge trapping structure are disposed in the non-volatile memory of the present invention to replace the conventional ONO structure, and the top oxide layer is not required in the present invention, such that the problem of not being able to control the thickness of the top oxide layer is avoided, and the performance for operating the memory component is further improved.

In addition, since the channel-hot-hole-induced hot-electron-injection effect is used in the method for writing the memory, the writing efficiency is less affected by the thickness of the tunneling dielectric layer. Moreover, during the erase operation, the electrons do not pass through the tunneling dielectric layer, thus a tunneling dielectric layer with a very small thickness is not required such as in the conventional non-volatile memory. Accordingly, the thickness of the tunneling dielectric layer in the present invention may be larger. With the thicker tunneling dielectric layer, during the erase operation, since there is no electron entering the charge trapping structure from the n-well through the tunneling dielectric layer, the efficiency of the erase operation would not deteriorate to a level of causing erase saturation, thus the erase speed is improved in the present invention.

On the other hand, it is known from the operating mechanism that during the writing operation, the electrons are injected from the p-channel to the charge trapping structure through the tunneling dielectric layer. In addition, during the erase operation, the electrons enter the gate from the charge trapping structure. Alternatively, the holes enter the charge trapping structure from the gate to re-combine with the electrons originally stored therein for neutralization. Since the high voltage stress generated in two different operations (the write and erase operations) are not at the same place, the reliability of the memory component is better than the conventional non-volatile memory component which can only pass through the tunneling oxide layer.

Furthermore, since the thicker tunneling dielectric layer can reduce current leakage (such as field dependent trap-assisted tunneling or thermionic emission) and the electrons stored in the charge trapping structure is unlikely to escape, the charge retention of the memory component is significantly improved, which greatly improves the performance and reliability of the memory device.

Regarding to the operating voltage, all of the operation voltages in the present invention are positive voltages. In other words, there is no negative voltage operation, thus the deep n-well is not required to insulate the negative voltage in peripheral circuitry, which reduces a process of DNW photomask.

The memory gate electrode can be formed on the same step for the gate of the select transistor. That is, only single polysilicon layer is needed to embed the non-volatile memory into generic logic process. The manufacturing cost is further reduced when compared with the floating gate technology (with at least two polysilicon layers).

BRIEF DESCRIPTION DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE EMBODIMENTS

Figure 1:
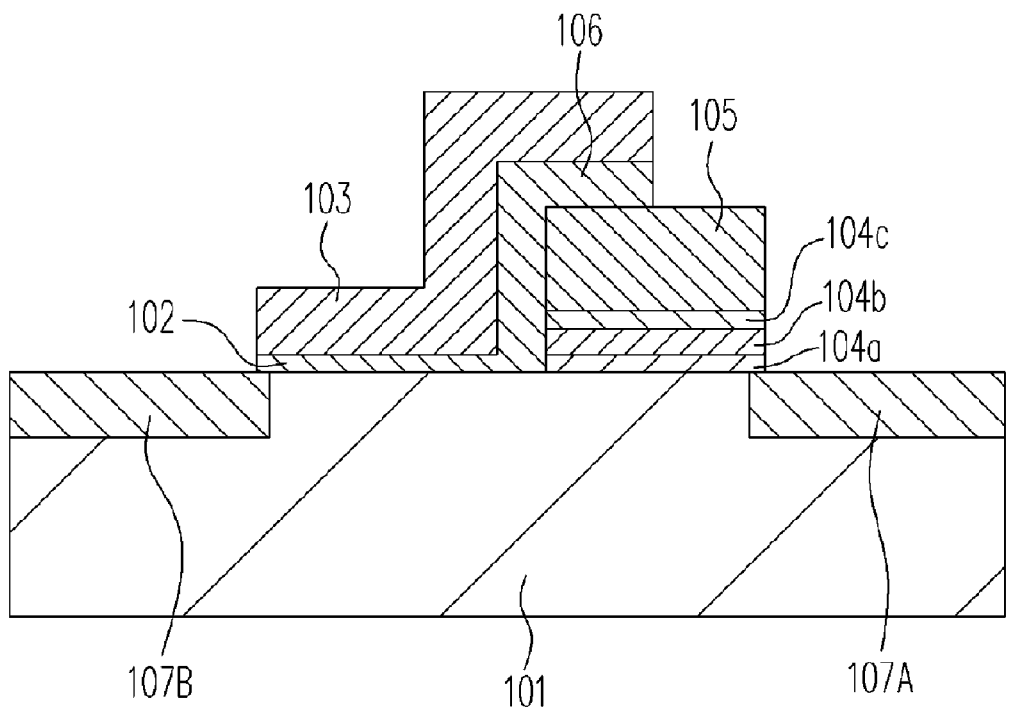
FIG. 1 is a schematic structural cross-sectional diagram of a conventional non-volatile memory.
Figure 2:
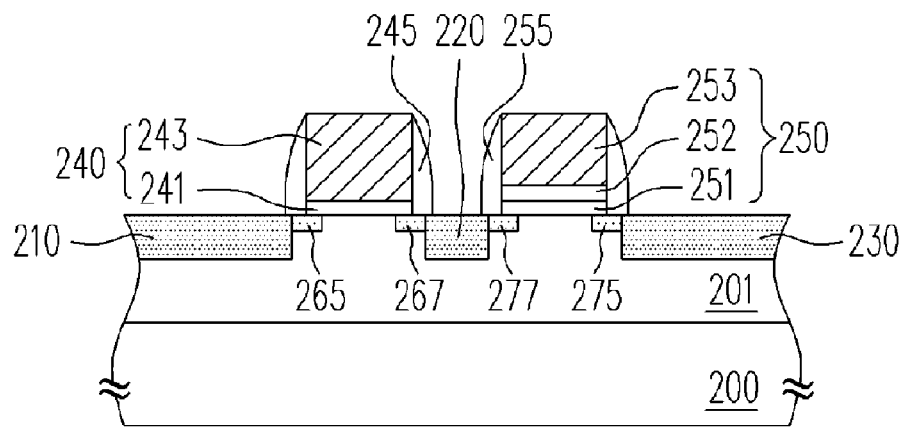
FIG. 2 is a schematic structural cross-sectional diagram of a non-volatile memory according to an embodiment of the present invention.

FIG. 2 is a schematic structural cross-sectional diagram of a non-volatile memory according to an embodiment of the present invention.

Referring to FIG. 2, the non-volatile memory may comprise a p-substrate 200, an n-well 201, a p-doped region 210, a p-doped region 220, a p-doped region 230, a gate structure 240, and a gate structure 250. Wherein, the n-well 201 may be disposed in the p-substrate 200. The p-doped region 210, the p-doped region 220, and the p-doped region 230 are disposed in the n-well 201 from left to right, respectively. The gate structure 240 is disposed on the p-substrate 200 between the p-doped region 210 and the p-doped region 220, and the gate structure 250 is disposed on the p-substrate 200 between the p-doped region 220 and the p-doped region 230.

The gate structure 240, from the p-substrate 200 up, comprises, a gate dielectric layer 241, and a select gate layer 243. The gate structure 250, from the p-substrate 200 up, comprises a tunneling dielectric layer 251, a charge trapping material 252, and a gate 253. Wherein, the material of the gate dielectric layer 241 and the tunneling dielectric layer 251 is silicon oxide, for example. The material of the select gate 243 and the memory gate 253, for example is p-doped or n-doped polysilicon. The material of the charge trapping material 252 is, for example, silicon nitride, silicon oxynitride or other material capable of trapping the charges, such as nano-crystal, tantalum oxide ($TaO_n$), $SrTiO_3$, and hafnium oxide ($HfO_n$). In addition, two spacers 245 and 255 may be further disposed on the sidewalls of the gate structures 240 and 250. Wherein, the material of the spacers 245 and 255 is proper insulating material such as silicon oxide, BPSG or PSG.

Moreover, a light p-doped region may be further disposed under the gate structures 240 and 250. The light p-doped region may be a light p-doped region 265 that is disposed in the p-substrate 200 adjacent to the p-doped region 210 below the gate structure 240, a light p-doped region 275 that is disposed in the p-substrate 200 adjacent to the p-doped region 230 below the gate structure 250, and a light p-doped region 277 that is disposed in the p-substrate 200 adjacent to the p-doped region 220 below the gate structure 250. The disposition of the light doped regions can reduce the short channel effect and increase the stability and reliability of the memory.

A structure of the non-volatile memory comprising the p-substrate, the n-well, and the light p-doped region mentioned above is exemplified hereinafter. Of course, although the embodiment mentioned above comprises the well, the well may be optionally disposed based on the physical requirement. If the well is not configured, the type of the substrate is different from the type of the doped region. For example, it may have an n-substrate and a p-doped region.

In the non-volatile memory of the present invention, the tunneling dielectric layer 251 and the charge trapping material 252 (oxide-nitride, ON) are disposed to replace the conventional oxide-nitride-oxide (ONO) structure, which reduces the fabricating steps, and also do without the problem of not being able to control the thickness of the top oxide layer while using the hydrofluoric acid as the etching agent in the conventional technique.

Moreover, since the gate structures 240 and 250 of the non-volatile memory provided by the present invention comprise a single layer of doped polysilicon, the non-volatile memory can be easily integrated into the general CMOS logic process, such that the manufacturing process is simplified.

Furthermore, the present invention uses channel-hot-hole-induced hot-electron-injection to perform the write program operation for the memory, and performs the erase operation for the memory by injecting the electrons into the gate from the charge trapping structure or injecting the holes into the charge trapping structure from the gate, which are different from the conventional operating mode. Thus, the efficiency of programming and erasing the memory is less affected by the thickness of the tunneling dielectric layer 251, and the fabrication of the tunneling dielectric layer with a very small thickness is not required. Accordingly, the problem such as increased current leakage and the dropping collapse voltage can be prevented, and there is less erase saturation, thus the erase speed is improved and the data retention of the memory and the reliability of the component are further enhanced.

In addition, since the memory device is operated with positive voltage, the process of disposing a deep n-well (NDW) can be omitted, and the manufacturing cost is further reduced.

Figure 3A:
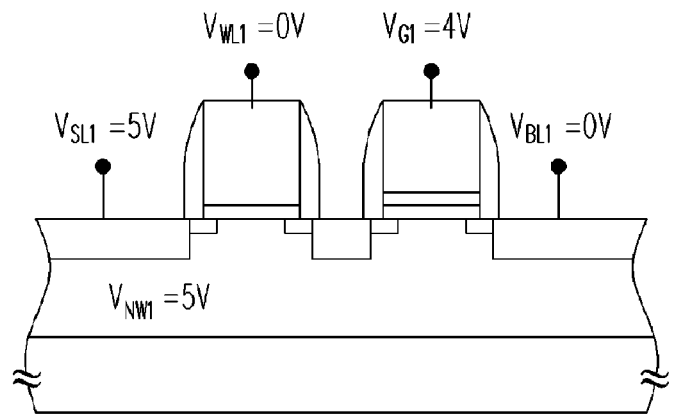
FIG. 3A is a schematic diagram illustrating a write program operation mode for a non-volatile memory according to an embodiment of the present invention.
Figure 3B:
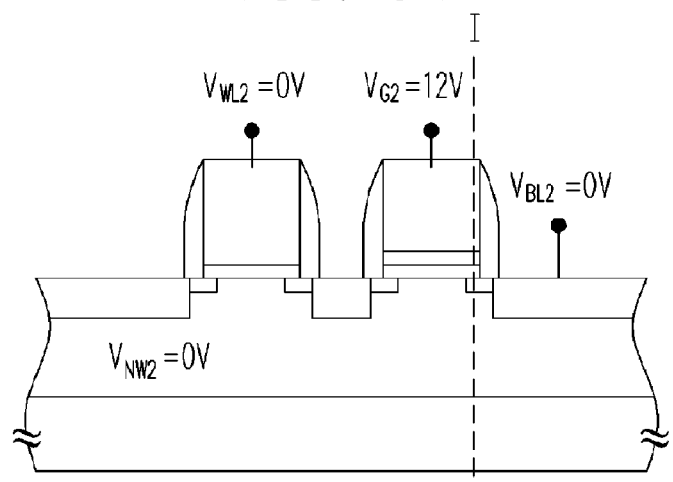
FIG. 3B is a schematic diagram illustrating an erase operation mode for a non-volatile memory according to an embodiment of the present invention.
Figure 3C:
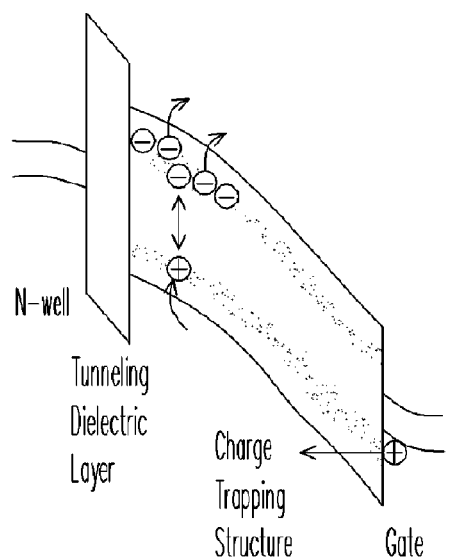
FIG. 3C is an energy band diagram along the line I-I' on the erase operation mode in FIG. 3B.

The method for operating the non-volatile memory mentioned above is described hereinafter. FIG. 3A is a schematic diagram illustrating a write program operation mode for a non-volatile memory according to an embodiment of the present invention. FIG. 3B is a schematic diagram illustrating an erase operation mode for a non-volatile memory according to an embodiment of the present invention. FIG. 3C is an energy band diagram along the line I-I' in FIG. 3B.

A method for operating the p-channel non-volatile memory is exemplified in the present embodiment. Referring to FIG. 3, the p-channel non-volatile memory comprises a p-substrate, an n-well, and two serially connected p-type transistors, for example. Wherein, the n-well is disposed in the p-substrate, and two p-type transistors are disposed on the n-well. The source of the select transistor is electrically coupled to a source line, and the drain of the select transistor is serially connected to a source of the memory transistor. The charges are stored in the memory transistor for writing, reading, and erasing operations. In addition, the memory transistor comprises a tunneling dielectric layer, a charge trapping structure, and a gate from the bottom up. The drain of the memory transistor is electrically coupled to a bit line. The material of the tunneling dielectric layer is silicon oxide, for example. The material of the charge trapping structure is silicon nitride, for example, and that of the gate is p-doped polysilicon.

Referring to FIG. 3A, during the write program operation, a voltage $V_{G1}$ about 4 volts is applied on the gate of the memory transistor, a voltage $V_{SL1}$ about 5 volts is applied on the source (the source line) of the select transistor, a voltage $V_{BL1}$ about 0 volt is applied on the drain (the bit line) of the memory transistor, a voltage $V_{NW1}$ about 5 volts is applied on the n-well, and a voltage $V_{WL1}$ about 0 volt is applied on the gate of the select transistor to turn on the select transistor during the writing operation. Wherein, the voltage applied on the source line $V_{SL1}$ is greater than the voltage applied on the bit line $V_{BL1}$, and the voltage applied on the n-well $V_{NW1}$ is greater than the gate voltage $V_{G1}$ of the memory transistor. Accordingly, the electrons are injected into the charge trapping structure of the memory transistor by using the channel-hot-hole-induced hot-electron-injection effect.

Referring to FIG. 3B, during the erase operation, a voltage $V_{G2}$ about 12 volts is applied on the gate of the memory transistor, a voltage $V_{BL2}$ about 0 volt is applied on the drain (the bit line) of the memory transistor, a voltage $V_{NW2}$ about 0 volt is applied on the n-well, and the source (the source line) of the select transistor is floating or a voltage $V_{WL2}$ about 0 volt is applied on the gate of the select transistor to turn off the channel. Wherein, the gate voltage $V_{G2}$ of the memory transistor is greater than the voltage applied on the bit line $V_{BL2}$, and the gate voltage $V_{G2}$ of the memory transistor is greater than the voltage applied on the n-well $V_{NW2}$, such that the electrons are attracted into the gate from the charge trapping structure or the holes are injected to the charge trapping structure from the gate in order to erase the memory transistor.

FIG. 3C is an energy band diagram along the line I-I' in FIG. 3B. Since the gate voltage $V_{G2}$ of the memory transistor is greater than the voltage applied on the n-well $V_{NW2}$, the holes in the gate will move to the charge trapping structure, and the electrons stored in the charge trapping structure will move to the gate, such that the charges originally stored in the charge trapping structure are erased. Note that the electrons do not pass through the tunneling dielectric layer.

Although the p-channel non-volatile memory with an n-well is exemplified herein to describe an embodiment of the operating method, the p-channel non-volatile memory with an n-substrate rather than the n-well is also suitable for the operating method mentioned above. By merely switching the voltage originally applied on the n-substrate to the n-well, the memory can be easily programmed and erased. Since this technique is known to one of the ordinary skill in the art, details are omitted herein.

The method for operating the p-channel non-volatile memory mentioned above applies the channel-hot-hole-induced hot-electron-injection effect to write data to the memory. In addition, the method of erasing the memory is to attract the electrons into the gate from the charge trapping structure and to inject the holes to the charge trapping structure from the gate. Since the erase operation is not performed by the tunneling effect, which pushes the charges stored in the charge trapping structure to enter the substrate, the operating efficiency is less affected by the thickness of the tunneling dielectric layer. In other words, the non-volatile memory of the present invention allows a tunneling dielectric layer to have a certain thickness, which not only avoids the erase saturation when the electrons are injected into the charge trapping structure during the erase operation, but also reduces the current leakage, such that the data retention of the memory is improved.

In summary, the fabrication of the non-volatile memory provided by the present invention can be integrated with the general CMOS logic process, thus its manufacturing process is simplified and the problem of not being able to control the thickness of the film is prevented.

Furthermore, since the mechanism for operating the memory is different from the conventional technique, the efficiency of the programming and erasing operations is less affected by the thickness of the tunneling dielectric layer. Thus, the tunneling dielectric layer doesn't necessarily have to be made with a very small thickness. Accordingly, the problem such as increased current leakage and the dropping collapse voltage are resolved, and there is less erase saturation, thus the erase speed is improved and the data retention of the memory and the reliability of the component are further enhanced.

Although the invention has been described with reference to a particular embodiment thereof, it will be apparent to one of the ordinary skill in the art that modifications to the described embodiment may be made without departing from the spirit of the invention. Accordingly, the scope of the invention will be defined by the attached claims not by the above detailed description.

What is claimed is:

1. A non-volatile memory, at least comprising:
   a substrate;
   a well, disposed in the substrate;
   a first doped region, a second doped region, and a third doped region, disposed in the well respectively, wherein the second doped region is disposed between the first doped region and the third doped region;
   a first gate structure, disposed on the substrate between the first doped region and the second doped region; and
   a second gate structure, disposed on the substrate between the second doped region and the third doped region, the second gate structure comprising a tunneling dielectric layer, a charge trapping material, and a gate from the bottom up, wherein the charge trapping material consists of a material with spatially spread and separated electrical-potential traps, and the charge trapping material disposed on the well directly.

2. The non-volatile memory of claim 1, wherein the first doped region, the second doped region, and the third doped region are p-doped regions.

3. The non-volatile memory of claim 2, wherein the substrate is an n-substrate.

4. The non-volatile memory of claim 1, wherein the first doped region, the second doped region, and the third doped region are p-doped regions, the well is an n-well, and the substrate is a p-substrate.

5. The non-volatile memory of claim 1, wherein the material of the charge trapping structure comprises silicon nitride or silicon oxynitride.

6. The non-volatile memory of claim 1, wherein the material of the tunneling dielectric layer comprises silicon oxide.

7. The non-volatile memory of claim 1, wherein the material of the gate comprises doped polysilicon.

8. The non-volatile memory of claim 1, wherein the first gate structure, from the substrate up, comprises a gate dielectric layer and a select gate electrode.

9. The non-volatile memory of claim 8, wherein the material of the select gate electrode comprises doped polysilicon.

10. The non-volatile memory of claim 8, wherein the material of the gate dielectric layer comprises silicon oxide.

11. The non-volatile memory of claim 1, wherein the sidewalls of the first gate structure and the second gate structure further comprise a spacer.

12. A method for operating a p-channel non-volatile memory comprising a select transistor and a memory transistor serially connected on a substrate, wherein the source of the select transistor is electrically coupled to a source line, the drain of the select transistor is serially connected to a source of the memory transistor, the memory transistor comprises a tunneling dielectric layer, a charge trapping structure, and a gate from the bottom up, a drain of the memory transistor is electrically coupled to a bit line; the operating method comprising:
   during the erase operation, applying a first voltage onto a gate of the memory transistor, applying a second voltage onto the drain of the memory transistor, applying a third voltage onto the substrate, and floating the source of the select transistor or applying a fourth voltage onto the gate of the select transistor to turn off the select transistor, so as to attract the electrons to enter the gate from the charge trapping structure, or to inject the holes into the charge trapping structure from the gate for erasing the memory transistor, wherein the first voltage is greater than the second voltage, and the first voltage is greater than the third voltage.

13. The method for operating the p-channel non-volatile memory of claim 12, further comprising:
   during the program operation, applying a fifth voltage onto the gate of the memory transistor, applying a sixth voltage onto the source of the select transistor, applying a seventh voltage onto the drain of the memory transistor, applying an eighth voltage onto the substrate, and applying a ninth voltage onto the gate of the select transistor to turn on the select transistor, so as to trigger the channel-hot-hole-induced hot-electron-injection effect to program the memory transistor, wherein the sixth voltage is greater than the seventh voltage, and the eighth voltage is greater than or equal to the fifth voltage.

14. The method for operating the p-channel non-volatile memory of claim 13, wherein the first voltage is 12 volts, the second voltage is 0 volt, the third voltage is 0 volt, and the fourth voltage is 0 volt.

15. The method for operating the p-channel non-volatile memory of claim 13, wherein the fifth voltage is 4 volts, the sixth voltage is 5 volts, the seventh voltage is 0 volt, the eighth voltage is 5 volts, and the ninth voltage is 0 volt.

16. The method for operating the p-channel non-volatile memory of claim 12, wherein the material of the charge trapping structure comprises silicon nitride or silicon oxynitride.

17. The method for operating the p-channel non-volatile memory of claim 12, wherein the material of the gate comprises p-doped polysilicon.

* * * * *